US007701302B2

(12) United States Patent
Koyama

(10) Patent No.: US 7,701,302 B2
(45) Date of Patent: Apr. 20, 2010

(54) ATOMIC FREQUENCY ACQUIRING APPARATUS AND ATOMIC CLOCK

(75) Inventor: Tomoko Koyama, Hara-mura (JP)

(73) Assignee: Seiko Epson Corporation (JP)

( * ) Notice: Subject to any disclaimer, the term of this patent is extended or adjusted under 35 U.S.C. 154(b) by 131 days.

(21) Appl. No.: 11/615,409

(22) Filed: Dec. 22, 2006

(65) Prior Publication Data

US 2007/0146085 A1 Jun. 28, 2007

(30) Foreign Application Priority Data

Dec. 28, 2005 (JP) ............................ 2005-377480

(51) Int. Cl.
*H03B 17/00* (2006.01)

(52) U.S. Cl. ......................................... 331/94.1; 331/3

(58) Field of Classification Search .................... 331/3, 331/94.1

See application file for complete search history.

(56) References Cited

U.S. PATENT DOCUMENTS 5,173,749 A * 12/1992 Tell et al. .................... 356/437
5,317,156 A * 5/1994 Cooper et al. ............... 250/345
5,327,105 A * 7/1994 Liberman et al. .......... 331/94.1
5,340,986 A * 8/1994 Wong ......................... 250/343
5,550,375 A * 8/1996 Peters et al. ................ 250/343
6,353,225 B1 * 3/2002 Strzoda et al. ......... 250/339.13
6,570,459 B1 5/2003 Nathanson
6,900,702 B2 5/2005 Youngner
7,064,835 B2 * 6/2006 Riley et al. ................. 356/437

* cited by examiner

*Primary Examiner*—Robert Pascal
*Assistant Examiner*—Levi Gannon
(74) *Attorney, Agent, or Firm*—Harness, Dickey & Pierce, P.L.C.

(57) ABSTRACT

An atomic frequency acquisition apparatus includes: a cell enclosing atomic gas therein; a laser light source that oscillates a laser light that enters the cell and excites the atomic gas; and a photodetecting section that detects the laser light that has passed through the cell, wherein the cell has at least a laser light reflection section inside thereof.

8 Claims, 5 Drawing Sheets

ATOMIC FREQUENCY ACQUIRING APPARATUS AND ATOMIC CLOCK

The entire disclosure of Japanese Patent Application No. 2005-377480, filed Dec. 28, 2005 is expressly incorporated by reference herein.

BACKGROUND

1. Technical Field

The present invention relates to atomic frequency acquiring apparatuses and atomic clocks.

2. Related Art

Atomic clocks that control the frequency of an oscillator based on the natural frequency of atoms are more often used in various situations instead of conventional quartz oscillators. Above all, coherent population trapping (CPT) type atomic clocks are suitable for miniaturization and power-saving, and are expected to be applied to cellular phones or other devices in future. In this connection, U.S. Pat. No. 6,900,702 and U.S. Pat. No. 6,570,459 are examples of related art.

SUMMARY

In accordance with an advantage of some aspects of the present invention, atomic clocks can be made smaller in size, while maintaining the accuracy of the atomic clocks.

An atomic frequency acquisition apparatus in accordance with an embodiment of the invention is equipped with: a cell enclosing atomic gas therein, a laser light source that oscillates a laser light that enters the cell and excites the atomic gas, and a photodetecting section that detects the laser light that has passed through the cell, wherein the cell has at least a laser light reflection section inside thereof.

By this structure, the optical path of the laser light within the cell can be made longer, such that a greater distance can be secured for the laser light to pass through the atomic gas, and therefore the apparatus can be made smaller in size without deteriorating the accuracy.

In one aspect, the cell may preferably be provided with a first reflection section on which the laser light oscillated from the laser light source is incident at an incident angle of 45 degrees, and a second reflection section on which the laser light reflected by the first reflection section is incident at an incident angle of 45 degrees. Accordingly, the optical path within the cell can be secured with a relatively simple structure.

In one aspect, a surface-emitting type laser light source may be used as the laser light source.

Further, the reflection section may be provided with a reflection film that increases the reflection coefficient of the laser light. The reflection film may be composed of, for example, Al alloy, Ag alloy or the like, which reflects the laser light.

Also, the laser light source and the photodetecting section may be formed in one piece. As a result, position alignment of the laser light source and the photodetecting section can be simplified.

Furthermore, the reflection section may be formed with a curved surface. As a result, even when the laser light is emitted with a flare angle, the flaring can be suppressed by the focusing action of the reflection surface, and the amount of light received by the photodetection section is increased, such that the accuracy of the apparatus is improved.

The atomic frequency acquisition apparatus in accordance with an aspect of the invention may be used to acquire a time standard frequency in an atomic clock.

DESCRIPTION OF EXEMPLARY EMBODIMENTS

Preferred embodiments of the invention are described below with reference to the accompanying drawings.

Embodiment 1

Figure 1:
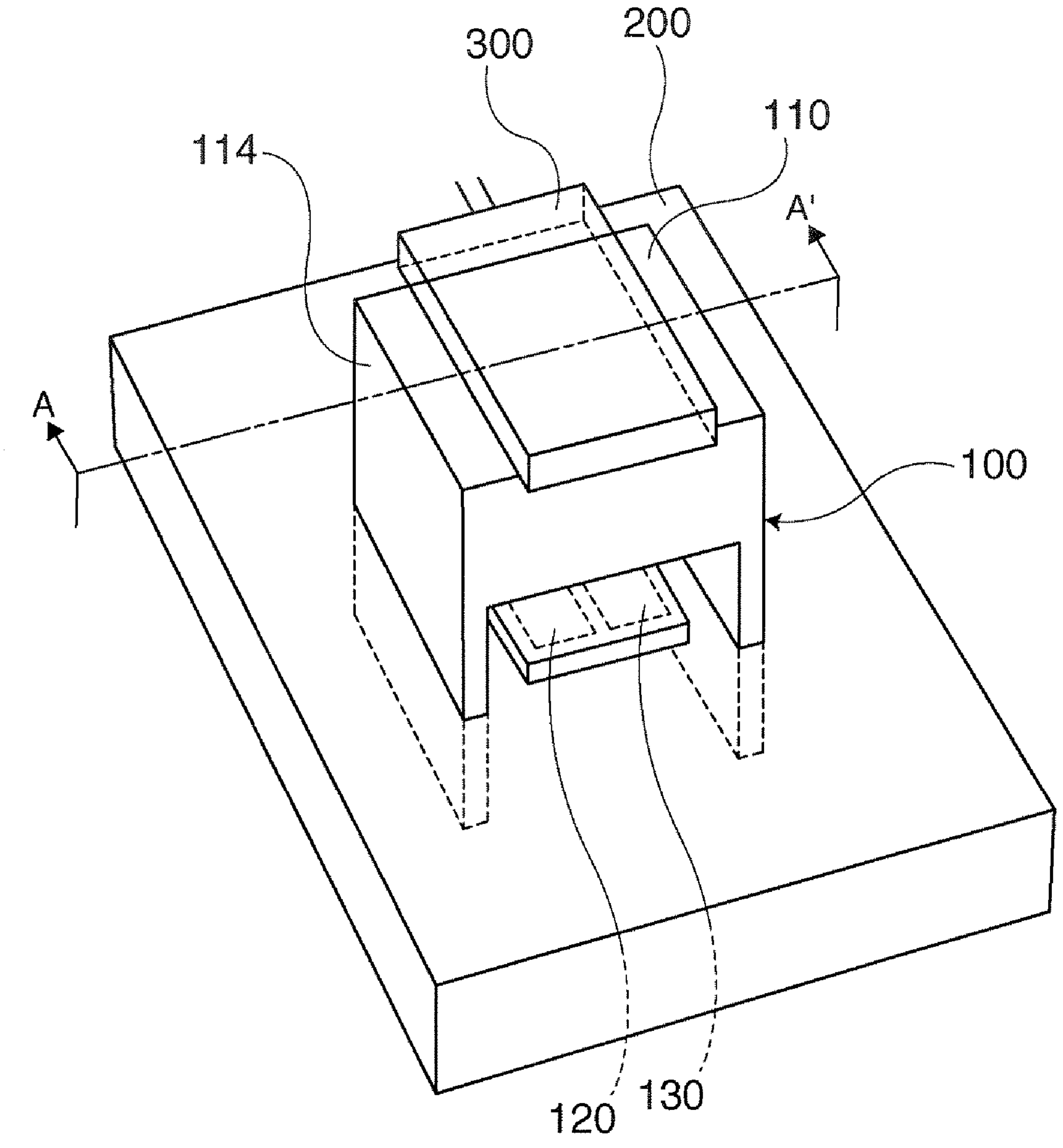
FIG. 1 is a perspective view of the structure of an atomic frequency acquisition apparatus in accordance with an embodiment 1 of the invention.
Figure 2A:
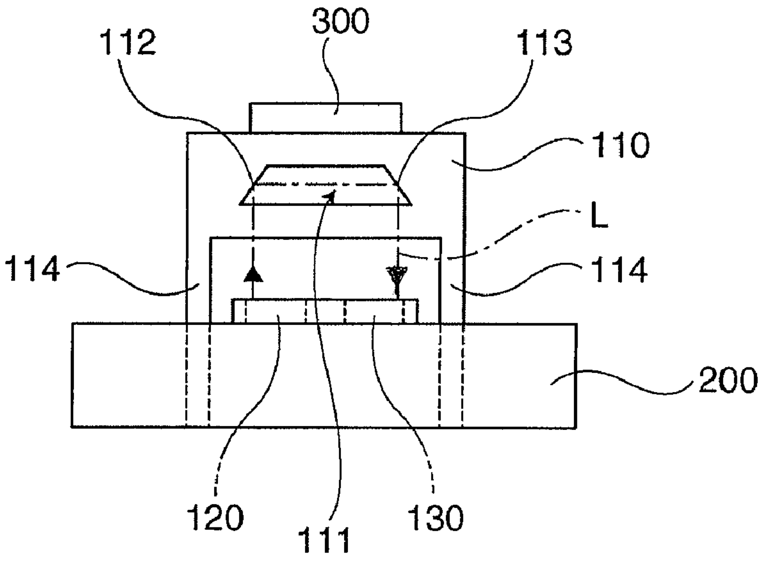
FIG. 2A is a cross-sectional view of the atomic frequency acquisition apparatus taken along a line A-A' of FIG. 1.
Figure 2B:
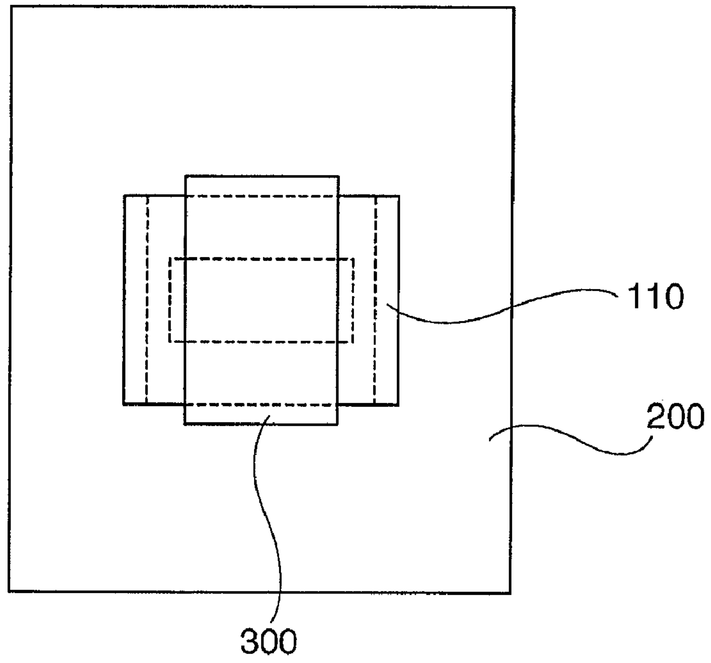
FIG. 2B is an upper plan view of the atomic frequency acquisition apparatus.

FIG. 1 is a perspective view of the structure of an atomic frequency acquisition apparatus 100 in accordance with an embodiment 1 of the invention. FIG. 2A is a cross-sectional view taken along a line A-A' in FIG. 1, and FIG. 2B is an upper plan view of the atomic frequency acquisition apparatus 100. The atomic frequency acquisition apparatus 100 may be used to acquire a time standard frequency in a CPT type atomic clock.

As shown in FIG. 1 and FIGS. 2A and 2B, the atomic frequency acquisition apparatus 100 is equipped with a cell 110, a laser diode (i.e., a laser light source) 120 and a photodetector (photodetection section) 130, which are mounted on a substrate 200 of an electronic apparatus having an electronic clock mounted therein. A heater 300 is mounted on an upper surface of the cell 110.

The laser diode 120, the photodetector 130 and the heater 300 are connected to a driver circuit by wirings (not shown).

The cell 110 is disposed on the substrate 200 with protruded sections 114. The laser diode 120 and the photodetector 130 are formed in one piece in accordance with the present embodiment.

In this exemplary embodiment, the laser diode 120 is a vertical cavity surface-emitting laser (VCSEL) (i.e., a vertical surface-emitting type laser diode).

The cell 110 has a light transmission section that is made of glass, and other portions of the cell may be made of, for example, metal. The cell 110 has a cavity (void space) 111 inside thereof. As the material of the cell 110, in addition to glass, any material that transmits laser light oscillated by the laser diode 120 (for example, laser light with a wavelength of 852 nm oscillated by a VCSEL) can be used. The cavity 111 encloses cesium atom gas. Reflection surfaces 112 and 113 (first and second reflection surfaces) are formed on a wall surface of the cavity 111. The reflection surfaces 112 and 113 may be formed with a metal film, thereby reflecting the laser light.

The reflection surface 112 is formed such that the laser light oscillated from the laser diode 120 and entered the cell 110 is incident upon the reflection surface 112 at an incident angle of 45 degrees. Also, the reflection surface 113 is formed such that the laser light reflected by the reflection surface 112 is incident upon the reflection surface 113 at an incident angle of 45 degrees. The cell 110 may be formed from glass.

The heater 300 is provided to maintain the temperature inside the cavity 111 at a constant level (80° C.-130° C.). The heater 300 heats the interior of the cell to thereby increase the cesium atom density, thereby increasing the atomicity to be excited by the laser light. As the atomicity to be excited increases, the sensitivity is improved, and therefore the accuracy of the atomic frequency acquisition apparatus 100 is improved.

Next, operations of the atomic frequency acquisition apparatus 100 are described. As shown in FIG. 2A, laser light (L) emitted from the laser diode 120 enters the cell 111, is reflected at the reflection surface 112 whereby its optical path is rotated through 90 degrees, is reflected at the reflection surface 113 whereby its optical path is again rotated through 90 degrees, passes through the wall of the cell 111, and is detected by the photodetector 130. The laser light excites cesium atoms in the cavity 111 while passing through the cavity 111. A difference between the upper and lower side-band frequencies of the laser light when the intensity of the laser light passing through the excited cesium atom gas becomes the maximum concurs with the natural frequency of cesium atoms. Accordingly, by conducting feed-back control with an external circuit such that the intensity of the laser light detected by the photodetector 130 becomes the maximum, the modulation frequency of the laser diode 120 is adjusted.

The feed-back control system may be composed of a control circuit and a local oscillator connected to the atomic frequency acquisition apparatus 100. Outputs of the photodetector 130 are supplied through the control circuit to the local oscillator to perform feed-back control, whereby the oscillation frequency of the local oscillator is stabilized based on the natural frequency of cesium atoms.

The oscillation frequency adjusted in a manner described above is acquired from the local oscillator, and used as a standard signal of an atomic clock.

According to the embodiment 1, laser light within the cell 110 changes its optical path at the reflection surfaces 112 and 113, such that a longer optical path can be secured. Accordingly, even when the volume of the cell 110 is small, the distance in which the laser light passes through the cesium atom gas can be made longer, such that a greater amount of cesium atoms can be excited, and the accuracy of the atomic frequency acquiring apparatus 100 can be maintained.

FIGS. 3A through 3D are schematic cross-sectional views of cells 110 in accordance with modified examples of the embodiment 1, and correspond to the cross-sectional view shown in FIG. 2A, respectively.

Figure 3A:
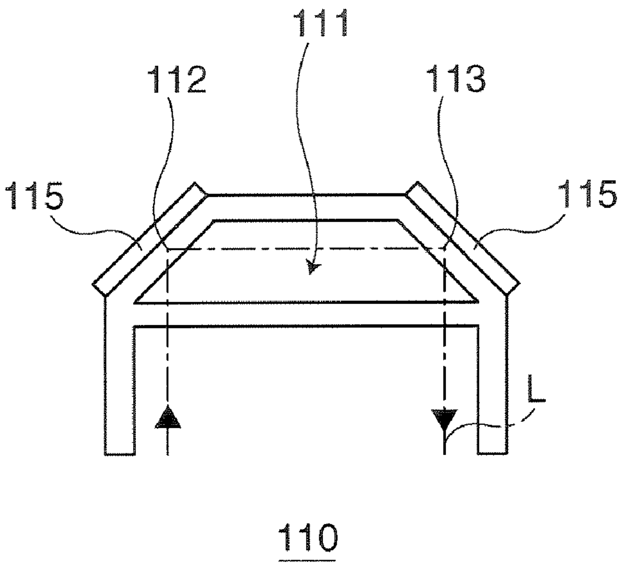
FIGS. 3A-3D are schematic cross-sectional views of cells in accordance with various modified exemplary embodiments.

The modified example shown in FIG. 3A is provided with reflection films 115 for improving the reflection coefficient of laser light on external wall surfaces corresponding to the reflection surfaces 112 and 113 of the cell 110, respectively. The reflection films 115 may be composed of, for example, Al alloy, Ag alloy or the like, that reflects laser light (in this example, a laser light with a wavelength of 852 nm oscillated by a VCSEL). As the reflection films 115 are provided on the external wall of the cell, the manufacturing process may be simplified.

Figure 3B:
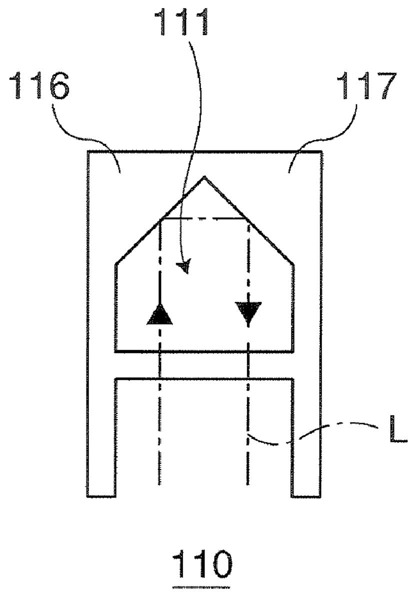

The modified example shown in FIG. 3B is provided with a reflection surface 116 on which laser light entering the cell 110 is incident at an incident angle of 45 degrees and a reflection surface 117 on which the laser light reflected by the reflection surface 116 is incident at an incident angle of 45 degrees, like the example shown in FIG. 2A. Compared to the example shown in FIG. 2A, the cell 110 has a greater height, and a smaller width. By providing such a configuration, the width of the cell 110 in the longitudinal direction can be made smaller. This structure can be used when the substrate 200 has a limited area.

Figure 3C:
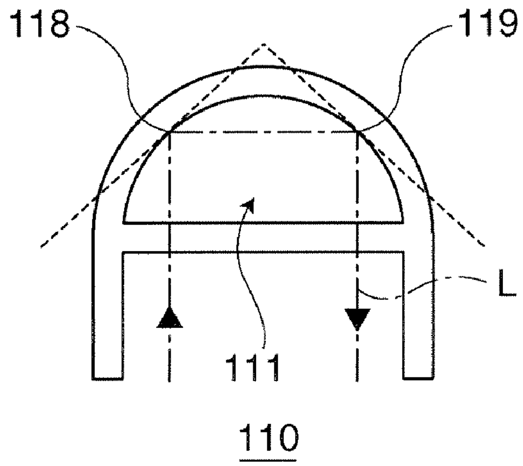

In the example shown in FIG. 3C, the cavity 111 is formed in a semicircular shape, wherein laser light entering the cell 110 changes its optical path through 90 degrees at a reflection point 118, changes its optical path again through 90 degrees at a reflection point 119, and enters the photodetector 130. By forming the reflection surface with a curved surface, even when laser light is emitted with a flare angle, the flaring can be suppressed by the focusing action of the reflection surface, and the amount of light received by the photodetector 130 can be increased, such that the accuracy of the atomic frequency acquisition apparatus 100 can be improved.

Figure 3D:
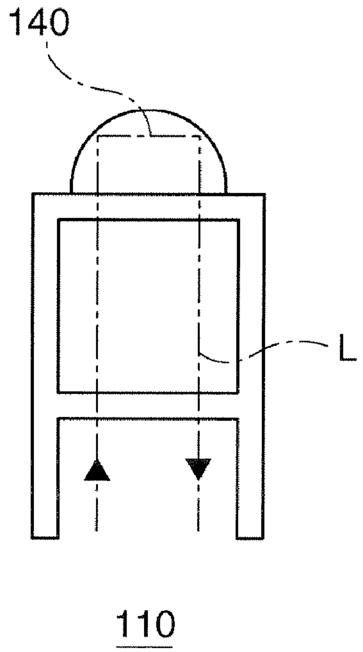

In the modified example shown in FIG. 3D, the cell 110 is provided on its top section with a lens 140. Laser light passing through the cell 110 is incident upon the lens 140, is reflected within the lens 140 at two locations thereby changing its optical path, passes again through the cell 110, and is incident upon the photodetector 130. The lens 140 may be formed by, for example, discharging droplets of ultraviolet setting type resin or the like by an inkjet apparatus. Therefore, the lens 140 can be readily manufactured, and therefore the manufacturing cost can be lowered.

Embodiment 2

Figure 4:
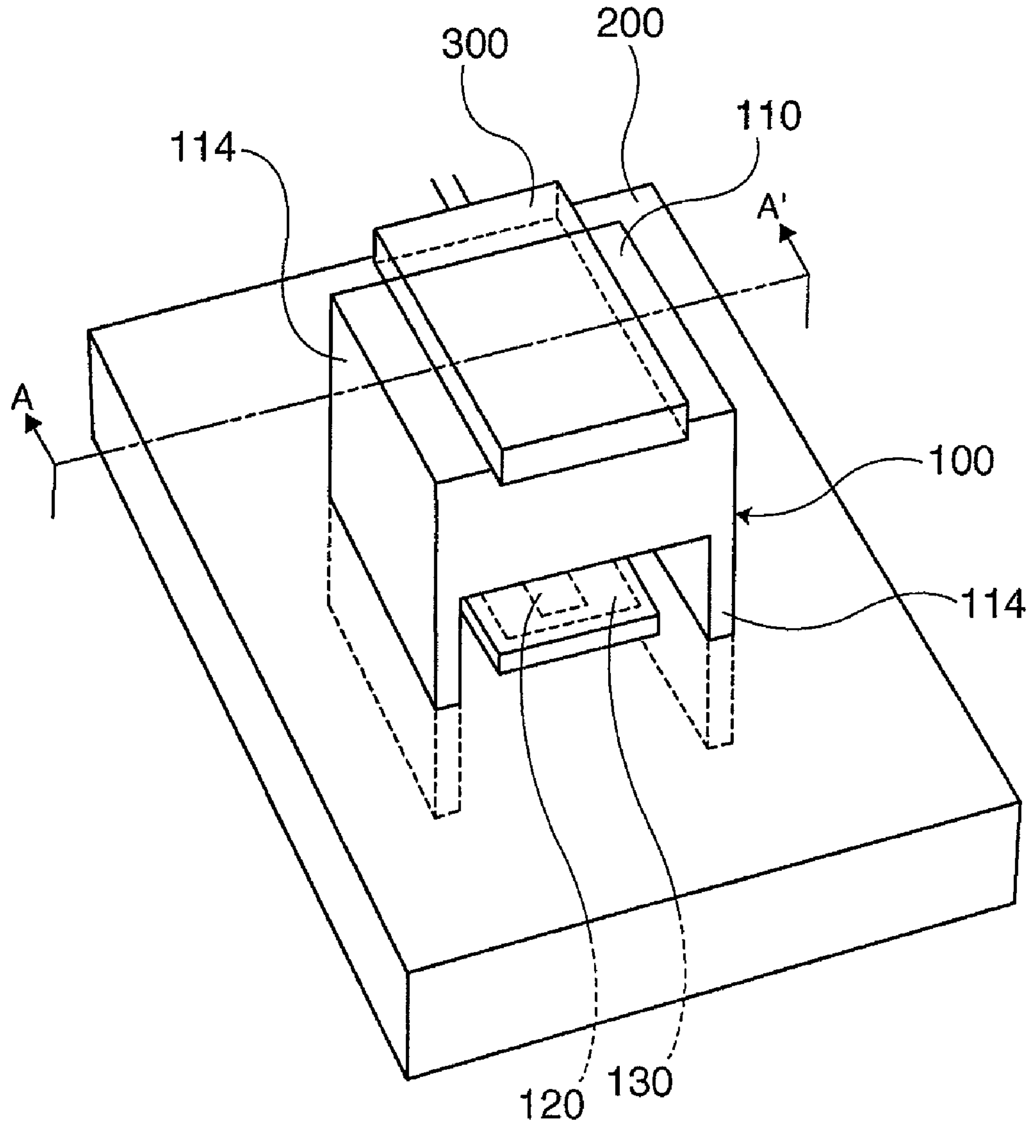
FIG. 4 is a perspective view of the structure of an atomic frequency acquisition apparatus in accordance with an embodiment 2 of the invention.
Figure 5A:
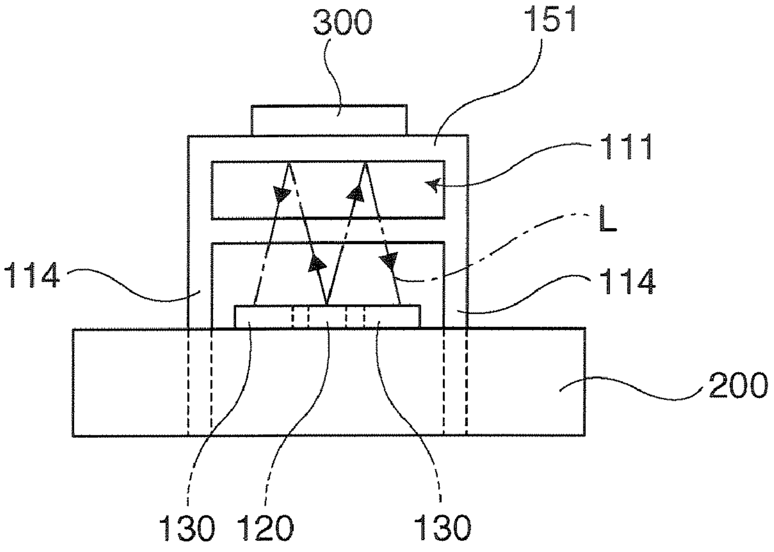
FIG. 5A is a cross-sectional view of the atomic frequency acquisition apparatus taken along a line A-A' of FIG. 4.
Figure 5B:
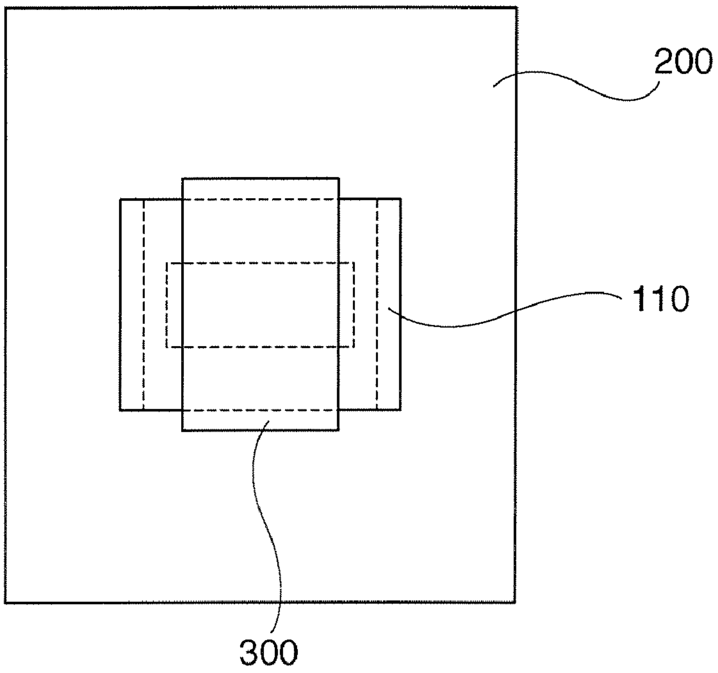
FIG. 5B is an upper plan view of the atomic frequency acquisition apparatus.

FIG. 4 is a perspective view of the structure of an atomic frequency acquisition apparatus 100 in accordance with an embodiment 2 of the invention. FIG. 5A is a cross-sectional view taken along a line A-A' in FIG. 4, and FIG. 5B is an upper plan view of the atomic frequency acquisition apparatus 100. The same reference numbers as those shown in FIG. 1 indicate the same components.

Like the embodiment 1, a laser diode 120 and a photodetector 130 are formed in one piece. However, in accordance with the embodiment 2, the laser diode 120 is provided at a central area, and the photodetector 130 is provided such that the photodetector 130 concentrically surrounds the circumference of the laser diode 120.

Laser light (L) emitted from the laser diode 120 has a predetermined emission angle, and linearly advances while broadening. The laser light entered the cell 110 is reflected at a reflection surface 151, and enters the photodetectors 130 on the left and right sides.

Compared to the embodiment 1, the apparatus of the embodiment 2 can detect laser light at higher efficiency, such that the accuracy of the apparatus can be improved. Moreover, it is not necessary to form sloped surfaces inside the cell 110 for reflecting the laser light, the apparatus in accordance with the embodiment 2 can be readily manufactured. It is noted that the embodiment 2 is effective particularly when the size of the cell 110 in the height direction can be secured to a degree.

What is claimed is:

1. An atomic frequency acquisition apparatus comprising:

a substrate;

a light reflecting structure positioned on the substrate, the light reflecting structure including a cavity portion and a light reflecting portion having a first area and a second area, the cavity portion being positioned between the substrate and the first and second areas of the light reflecting portion, the cavity portion storing an atom gas;

a light emitting element positioned between the substrate and the cavity portion, the light emitting element being located outside the cavity portion, the light emitting element emitting a light in a primary direction toward the light reflecting portion, the first area of the light reflecting portion reflecting the light linearly in a first reflecting direction that is perpendicular to the primary direction directly toward the second area of the light reflecting portion so that the light passes through the atom gas and excites atoms in the cavity portion while passing through the cavity portion, the second area of the light reflecting portion reflecting the light in a second reflecting direction that is substantially opposite the primary direction; and a first light detecting element positioned between the substrate and the cavity portion, the first light detecting element being located outside the cavity portion, the first light detecting element receiving the light that is reflected by the light reflecting portion in the second reflecting direction.

2. The atomic frequency acquisition apparatus according to claim 1, the atom gas being a cesium atom gas.

3. The atomic frequency acquisition apparatus according to claim 1, the light reflecting portion including a first reflection film and a second reflection film, the first and second reflection films being attached to a wall that defines the cavity portion, the first and second reflection films being positioned such that the first reflection film reflects a light emitted from the light emitting element toward the second reflection film and that the second reflection film reflects a light reflected from the first reflection film toward the light detecting element.

4. The atomic frequency acquisition apparatus according to claim 1, the light reflecting portion including first and second portions of a wall that defines the cavity portion, the first and second portions of the wall being positioned such that the first portion of the wall reflects a light emitted from the light emitting element toward the second portion of the wall and that the second portion of the wall reflects a light reflected from the first portion of the wall toward the light detecting element.

5. The atomic frequency acquisition apparatus according to claim 1, the light reflecting portion including a portion of a wall that defines the cavity portion, the portion of the wall having a semicircular shape, the portion of the wall being positioned such that a first part of the portion of the wall reflects a light emitted from the light emitting element toward a second part of the portion of the wall and that the second part of the portion of the wall reflects a light reflected from the first part of the portion of the wall toward the light detecting element.

6. The atomic frequency acquisition apparatus according to claim 1, further comprising:

a heater attached to a wall that defines the cavity portion, the heater being configured to control a temperature of the atom gas.

7. An atomic clock comprising the atomic frequency acquisition apparatus according to claim 1.

8. The atomic frequency acquisition apparatus according to claim 1, further comprising a protruded section that is coupled to both the light reflecting structure and the substrate, wherein the protruded section spaces the light reflecting structure apart from the light emitting element and the light detecting element.

* * * * *